United States Patent
Bartos et al.

(10) Patent No.: US 8,207,732 B2
(45) Date of Patent: Jun. 26, 2012

(54) MAGNETO-RESISTIVE SENSOR FOR MEASURING A MAGNETIC FIELD BASED ON AN ANISOTROPIC MAGNETO-RESISTIVE (AMR) EFFECT OR A GIGANTIC MAGNETO-RESISTIVE (GMR) EFFECT

(75) Inventors: Axel Bartos, Waltrop (DE); Armin Meisenberg, Dortmund (DE); Fritz Dettmann, Braunfels-Philippstein (DE)

(73) Assignee: Meas Deutschland GmbH, Dortmund (DE)

( * ) Notice: Subject to any disclaimer, the term of this patent is extended or adjusted under 35 U.S.C. 154(b) by 1111 days.

(21) Appl. No.: 10/572,009

(22) PCT Filed: Sep. 13, 2004

(86) PCT No.: PCT/EP2004/010192
§ 371 (c)(1),
(2), (4) Date: Apr. 17, 2008

(87) PCT Pub. No.: WO2005/026746
PCT Pub. Date: Mar. 24, 2005

(65) Prior Publication Data
US 2008/0191694 A1  Aug. 14, 2008

(30) Foreign Application Priority Data
Sep. 11, 2003  (DE) .................................. 103 42 260

(51) Int. Cl.
*G01R 33/02* (2006.01)
(52) U.S. Cl. ........................................................ 324/252
(58) Field of Classification Search ................... 324/252
See application file for complete search history.

(56) References Cited

U.S. PATENT DOCUMENTS

| 4,506,220 A | 3/1985 | Sawada et al. |
| 6,373,242 B1 * | 4/2002 | Wappling ................. 324/207.21 |
| 7,005,958 B2 * | 2/2006 | Wan ............................ 338/32 R |
| 2002/0149358 A1 | 10/2002 | Doescher |
| 2003/0128031 A1 * | 7/2003 | Doescher ....................... 324/252 |

FOREIGN PATENT DOCUMENTS

| DD | 260 773 A | 10/1988 |
| DE | 26 15 539 | 10/1976 |
| DE | 36 09 006 A | 9/1987 |
| DE | 43 35 826 A1 | 4/1995 |

(Continued)

OTHER PUBLICATIONS

"No-contact current measurement", Sensors, Electronics World, Nov. 1996.

*Primary Examiner* — Jay Patidar
(74) *Attorney, Agent, or Firm* — Howard IP Law Group, PC

(57) ABSTRACT

Magnetoresistive sensors based on the AMR or GMR effect exhibit substantially enlarged linear characteristic curve regions as a result of the fact that their resistances are composed of magnetoresistive layer strips of differing anisotropic forms. Differing anisotropic forms can be achieved by different strip widths, strip thicknesses, strip intervals or strip materials. The temperature compensation for the output voltage of the magnetoresistive sensors, at least at one point on the characteristic curve, is achieved by the series connection of an additional layer strip with a temperature coefficient that differs from that of the magnetoresistive material to at least one magnetoresistive resistance of the sensor.

16 Claims, 7 Drawing Sheets

FOREIGN PATENT DOCUMENTS

| | | |
|---|---|---|
| DE | 195 07 303 A1 | 9/1996 |
| DE | 198 39 450 A1 | 3/2000 |
| EP | 0 048 289 | 3/1982 |
| EP | 0 796 491 B1 | 11/1999 |
| GB | 2 281 654 A | 3/1995 |
| JP | 63179586 A | 7/1988 |
| JP | 03144387 A | 6/1991 |
| WO | WO 02/097464 A | 12/2002 |

* cited by examiner

MAGNETO-RESISTIVE SENSOR FOR MEASURING A MAGNETIC FIELD BASED ON AN ANISOTROPIC MAGNETO-RESISTIVE (AMR) EFFECT OR A GIGANTIC MAGNETO-RESISTIVE (GMR) EFFECT

BACKGROUND OF THE INVENTION

The invention is directed to sensors which employ either the anisotropic magneto-resistive effect (AMR) or the gigantic magneto-resistive effect (GMR) and are suitable for indicating magnetic fields. In particular, the sensor elements improved by the invention are employed for automatically identifying when a characteristic value is exceeded. For example, a particular field strength can be exceeded if a permanent magnet approaches in the position of the sensor, or when an increasing electric current flows through an electric conductor close to a sensor. In both cases, a switching operation can be initiated by the sensor when the characteristic value of its output signal is exceeded. Information about the position of the magnet or the current can be most easily obtained in the vicinity of the switching point, if a linear correlation with the sensor signal exists.

Sensors of the aforedescribed type are known in the art, however, their linearity and temperature independence are not adequate for the applications. For obviating these deficiencies in the case of AMR-sensors, EP 0 796 491 describes a circuit capable of compensating the non-linearity of the characteristic curve. However, the described circuit is complex and too expensive for many applications.

The changes in the resistance value of an AMR strip or a GMR strip in a magnetic field are typically nonlinear. For an AMR strip, where the magnetic fields is applied in the plane of the strip perpendicular to the current direction, the resistance changes with the square of the field strength. For a GMR strip, the resistance also changes with the square of the field strength for a spin-valve layer system, if the magnetization of the pinned ferromagnetic layer coincides with the longitudinal direction of the strips and the magnetic field is oriented perpendicular thereto. Sensors constructed of such strip resistors and arranged as Wheatstone bridges provide output signals that have essentially the same quadratic dependence on the magnetic field as the resistors.

Several patents already describe approaches to improve the linearity of sensor elements implemented as AMR sensors. For example, the published application DE 26 15 539 proposes to cover the magneto-resistive layer strips of the sensor resistors with a plurality of closely spaced non-magnetic layer strips with a high conductivity, wherein the longitudinal direction of the non-magnetic layer strips forms an angle of approximately 45° with the longitudinal direction of the magneto-resistive layer strips. This produces a linear characteristic curve for small positive and negative magnetic fields. The slope of the conductive layer strips is opposite to the slope of the magneto-resistive layer strips, which can also cause the resistance to change in opposite directions in the same magnetic field. The economic patent DD 260 773 proposes to expand the field range of the linear characteristic curve by constructing each magneto-resistive resistor from two parts having opposite slope of the high-conductivity layer strips while the angle of the remanence of the magneto-resistive strips can rotate differently. The different rotation can be achieved by different strip widths. In sensors where the characteristic curve is linearized by inclining the conductive layer strips on the magneto-resistive strips, the conductive layer strips disadvantageously lower the resistance values of the magneto-resistive strips to approximately one-third. This necessitates an increase of the sensor area by approximately the same factor, which is not economical. In addition, conductive layer strips with smaller widths in the range of approximately 1 μm and tolerances of no more than a few percent must be produced with a high accuracy in the slope angle. This is technologically very challenging. The aforementioned method for linearization can only be applied to AMR sensors because it is based on a change in the current direction in the resistive strips. This principle does not affect the resistance value of GMR sensors.

The temperature dependence of the output signal of the magneto-resistive sensors can be eliminated according to the document GB 2 281 654 by applying a thermometer layer on the substrate directly underneath the magneto-resistive layer and by correcting the sensor signal with an electronic circuit. According to the patent JP 63 179 586, a magneto-resistive layer with the same parameters as the field sensor arrangement is used as the thermometer layer. Both approaches disadvantageously require complex electronic circuitry and are difficult to adjust.

U.S. Pat. No. 4,506,220 describes an attempt to eliminate the temperature dependence of the sensor signal by arranging in each arm of the sensor bridge employing the same magneto-resistive material one resistor that is dependent on the magnetic field and another resistor that is independent of the magnetic field. The resistors that depend on the magnetic field are arranged in direct opposition in the bridge circuit and are connected in one point. This attempt, however, only prevents a common-mode offset at a different temperature. The temperature coefficient of the resistance change in a magnetic field is not changed, so that the bridge signal still changes with temperature.

In an arrangement proposed in the patent application EP 0 048 289, conductive sublayers with a negative temperature coefficient of the resistance are disposed underneath all magneto-resistive layers of the sensor which have a positive temperature coefficients of the resistance. The temperature coefficient of the double layer can be adjusted to zero by selecting a suitable ratio of the layer thicknesses of the magneto-resistive layers and the sublayers. The bridge resistance of a magneto-resistive sensor configured in a Wheatstone bridge can then also be made independent of the temperature. However, it would be a mistake to conclude that the signal of the sensor corresponding to the applied magnetic field is also the same at all temperatures. The temperature coefficient of the change of the resistance in the magnetic field for magneto-resistive layers has a negative value, whereas the temperature coefficient of the resistance has a positive value. The output signal of the magneto-resistive sensor decreases with increasing temperature, unless compensated. The sublayers disclosed in EP 0 048 289 are connected electrically in parallel with the resistors of the magneto-resistive layers. The change in resistance of the double layers that determines the signal when a magnetic field is applied, is therefore smaller than with only a single magneto-resistive layer. With increasing temperature, the resistance of the magneto-resistive layer and the resistance of the sublayer decreases. As a result, the change in resistance caused by the magnetic field also decreases. In total, one obtains a sensor output signal which increases even more with increasing temperature than the signal of a sensor which only consists of magneto-resistive layers.

SUMMARY OF THE INVENTION

It is an object of the invention to provide a magneto-resistive sensor on a substrate with a linear characteristic curve in the field ranges required for an application, which has a temperature-compensated output signal.

According to one aspect of the present invention, a sensor arrangement is based on the AMR or GMR effect with resistors formed from layer strips in form of a half or full bridge circuit on a substrate, wherein for increasing the linear region of the characteristic curves at least one of the resistors has magneto-resistive layer strips (6; 7; 8; 9) with a different shape anisotropy.

According to another aspect of the present invention, a sensor arrangement in form of a half or full bridge circuit has resistors formed of layer strips and disposed on a substrate, wherein for achieving a temperature independence of the output voltage in at least one point of the characteristic curve at least one of the resistors includes in addition to magneto-resistive layer strips having identical temperature coefficients of the resistance at least one additional layer strip connected in series and having a different temperature coefficient.

The sensor curve is linearized by connecting magneto-resistive layer strips with different shape anisotropy in series. Because the magneto-resistive layer strips do not carry conductive layer structures, their full resistance value is effective, and a certain required sensor resistance can be realized with a minimal sensor surface. The magnetic field range where the characteristic curve is linear can be adapted to the application by selecting a suitable number of layer strips having different shape anisotropy. The greater the linear region, the more layer strips of different shape anisotropy are required. For example, for an AMR sensor bridge only the two diagonally opposed resistors must be provided with layer strips of different widths, wherein the magnetic field to be measured is oriented perpendicular to the longitudinal direction of the layer strips. The two other bridge resistors advantageously include only layer strips with the smallest width. Consequently, only a minimal chip surface is required and the large shape anisotropy of the small layer strips results in a stable remanence, which necessarily leads to a constant resistance value at all magnetic fields to be measured. The constancy of the increase in the slope of the sensor curve can be significantly increased in the linearized region by an auxiliary magnetic field perpendicular to the direction of the measurement field of only 100 A/m.

Spin-valve systems have proven advantageous when using GMR layer systems for the linearized and temperature-stabilized magneto-resistive sensor. These include, referring to FIG. 10, a pinned ferromagnetic layer 20 with a direction of magnetization which is defined by the immediate adjacency of a natural or artificial antiferromagnetic layer and which cannot be noticeably influenced by the magnetic field strengths to be measured. They further include a free ferromagnetic layer 21, the magnetization of which can be easily rotated by external magnetic fields, and a non-magnetic intermediate layer 22 with a layer thickness selected so as to almost decouple the magnetization of the two ferromagnetic layers. The resistance value of the spin valve layer systems is at a minimum when the magnetizations of the two ferromagnetic layers are parallel, and at a maximum when they are antiparallel. If the magnetization of the pinned layer is adjusted to lie in the longitudinal direction of the strips and if the magnetization of the free layer is oriented in the same direction without external field due to the effect of the shape anisotropy, then the resistance value of the layer system increases with the square of the field strength for an external field perpendicular to longitudinal direction. Accordingly, the characteristic curve can therefore be linearized by employing the same means as for AMR sensors, i.e., by connecting the layer strips 24 with different shape anisotropy, in series. The shape anisotropy can be adjusted, for example, by suitable selection of the widths of the layer strips. By adjusting the magnetization of the layer strips of the resistors of each half bridge 25, 26 in opposite directions, both resistors then change in the opposite direction in a magnetic field. This doubles the sensor sensitivity. The same concept also applies for a full bridge where the diagonally opposing resistors have the same direction of magnetization of the pinned layer. The thickness of the non-magnetic intermediate layer of the spin-valve systems can be selected so that the two ferromagnetic layers have a slight ferromagnetic or antiferromagnetic coupling. The magnetization of the free layer can still easily rotate. The stability of the magnetization of the free layer increases significantly in the presence of interfering fields. The constancy of the slope of the linearized characteristic curve is similarly improved, as for AMR sensors, by applying a stabilizing field in the longitudinal direction of the strips.

The coupling field strengths may be different for different layer strips, as illustrated in FIG. 11, where magneto-resistive layer strips 6 and 7 of FIG. 1 are shown in cross-section on substrate 19; magneto-resistive layer strip 6 has ferromagnetic layers 20, 21 and non-magnetic intermediate layer 22, while magneto-resistive layer strip 7 has ferromagnetic layers 20', 21' and non-magnetic intermediate layer 22' of a different thickness from that of non-magnetic intermediate layer 22 of strip 6, thereby providing different coupling field strengths.

To realize stable sensor signals with changing temperature in a defined magnetic field to be measured by the series connection of magnetic field-independent layer resistors with negative temperature coefficient according to the invention when using the magneto-resistive layer strips, layer strips with a resistance value of approximately 1% of the resistance value of the magneto-resistive layer strips are adequate. The resulting decrease of the sensor signal compared to a sensor signal that is not thermally stabilized it is therefore negligible. The zero offset of the sensor bridge can be easily compensated with AMR sensors, if the resistance of the two bridge resistors that are not affected by the magnetic field is initially by approximately 1 ppm above that of the field-dependent resistors. The zero offset of the sensor bridge and the region of the characteristic curve which has the best temperature stabilization can be adjusted separately, if adjustment ranges are provided for both the magneto-resistive layer as well as the additional layer with negative temperature coefficient of the resistance value.

BRIEF DESCRIPTION OF THE DRAWING

The invention will now be described with reference to certain exemplary embodiments. The corresponding drawing includes the following figures.

DETAILED DESCRIPTION OF PREFERRED EMBODIMENTS

Figure 1:
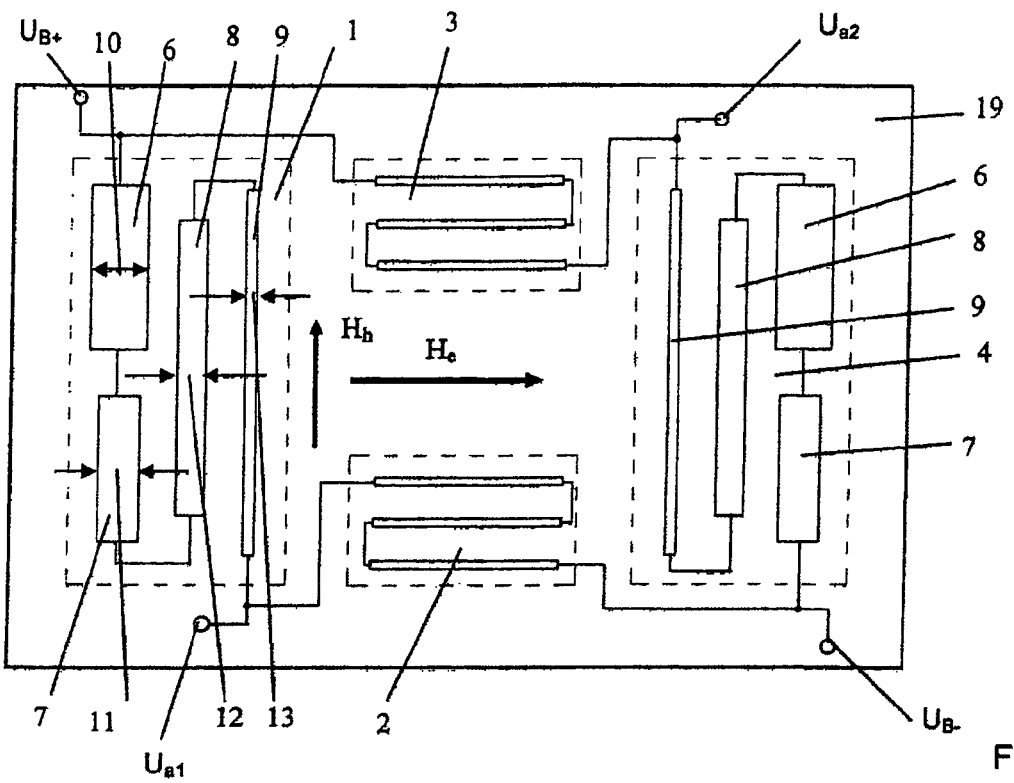
FIG. 1 is a diagram of an AMR sensor according to the invention with a linearized characteristic curve on a substrate.

FIG. 1 shows a magneto-resistive sensor bridge according to the invention with resistors 1; 2; 3; 4 constructed of AMR layer strips and disposed on a substrate 19. The resistors 1; 2; 3; and 4 are each enclosed by dashed lines. The operating voltage is applied to the bridge between the terminals $U_{B+}$ and $U_{B-}$. The output signal of the bridge is measured as a voltage difference between $U_{a2}$ and $U_{a1}$. The resistors 1 and 4, which are diagonally opposed in the electric circuit of the bridge (see FIG. 8) each include four AMR layer strips 6; 7; 8; 9. These AMR layer strips 6; 7; 8; 9 have parallel longitudinal strip directions, different shape anisotropies and different lengths and are in the depicted diagram arranged mirror-symmetric to the two resistors 1 and 4. The different shape anisotropy of the AMR layer strips 6; 7; 8; 9 is adjusted in FIG. 1 by selecting different widths 10; 11; 12; 13. Because the AMR layer strips 6; 7; 8; and 9 designated with the same reference symbol have identical properties, the resistance values of the resistors 1 and 4 are also identical. The resistors 2 and 3 are made of mutually parallel identical AMR layer strips with the same properties. The longitudinal direction of these AMR layer strips forms a right angle with the longitudinal direction of the AMR layer strips 6; 7; 8; 9. Due to the shape anisotropy, the magnetization of all AMR layer strips coincides with their respective longitudinal strip direction without applied magnetic fields $H_e$ and $H_h$. Because the electric current also flows through the AMR layer strips in the longitudinal direction, all resistors have their maximum resistance value without an applied magnetic field. The four resistance values have the same magnitude. The magnetization of the AMR layer strips of the resistors 2 and 3 does not change when the magnetic field $H_e$ to be measured is applied, because the magnetization was already in the direction of $H_e$. However, the magnetization of the AMR layer strips 6; 7; 8; 9 of the resistors 1 and 4 is deflected in the field direction, so that their resistance value decreases. The angle between the magnetization and the longitudinal direction of the strips is computed from the equation $$H_h \cdot \sin(\Phi_i) - H_e \cdot \cos(\Phi_i) + (H_k/2) \cdot \sin(2 \cdot \Phi_i) + (t/2 \cdot w) \cdot M_s \cdot \sin(2 \cdot \Phi_i) = 0$$

for each layer strip 6; 7; 8; 9 with the width w, the thickness t, the saturation magnetization $M_s$ and the anisotropy field strength of the material $H_k$. The resistance value $R_i$ of an AMR layer strip is a given by $$R_i = R_{0i} \cdot [1 - r_i \cdot \sin^2(\Phi_i)]$$

with $R_{0i}$ as the maximum resistance value of the respective AMR layer strip and $r_i$ as the maximum relative resistance change that can be achieved with the magnetic field.

Figure 4:
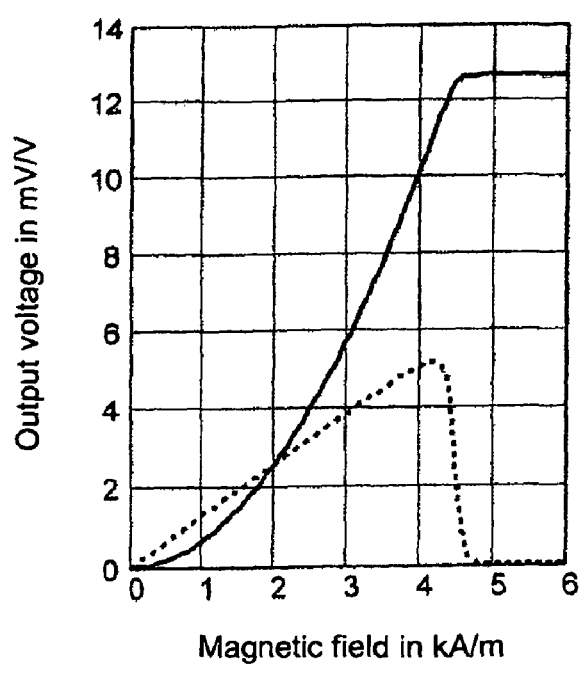
FIG. 4 is a characteristic curve of a conventional AMR sensor.

If, as a conventional approaches, only AMR layer strips with the same shape anisotropy, i.e., the same width, the same thickness and the same material, are used, then only one angle Φ is assumed at each magnetic field strength $H_e$ and the values of the two bridge resistors 1 and 4 changed as the square of the magnetic field $H_e$. The output signal of the bridge has then also a value that depends on the square of the magnetic field, as shown in FIG. 4. The width of the layer strips for the illustrated case is 6 μm, the thickness 25 nm, the saturation magnetization $10^6$ A/m, and the anisotropy field of the material 250 A/m. The maximum resistance change achievable in the magnetic field is approximately 2.5%. The solid curve in FIG. 4 represents the output voltage of the bridge at an operating voltage of one Volt. The increase of the output voltage is shown as a dotted line. The linear increase with the field shows the quadratic dependence of the bridge output voltage.

Figure 3:
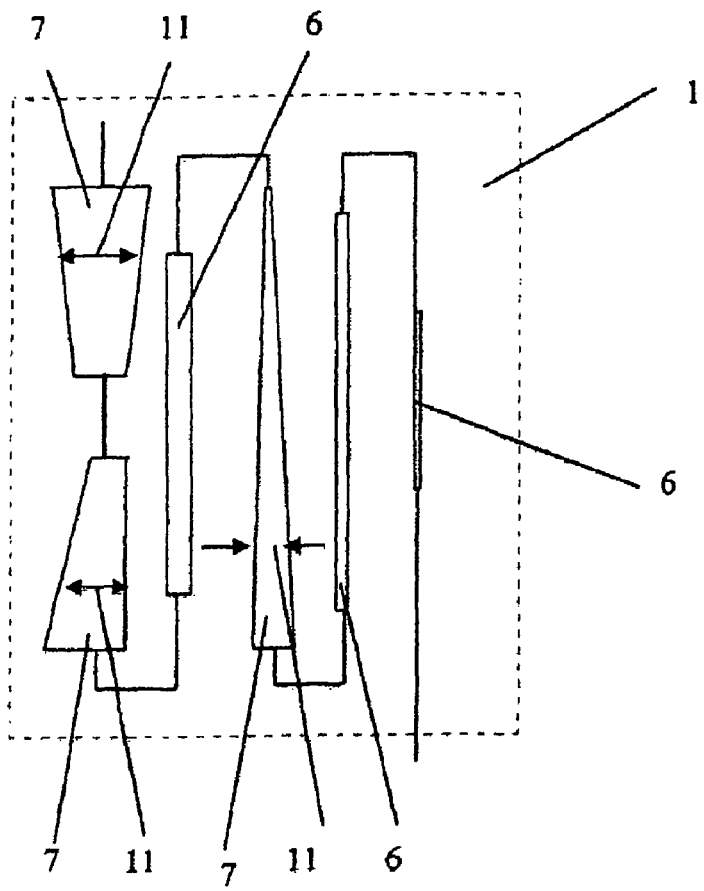
FIG. 3 is a diagram of another embodiment of a resistor of the sensor bridge.
Figure 5:
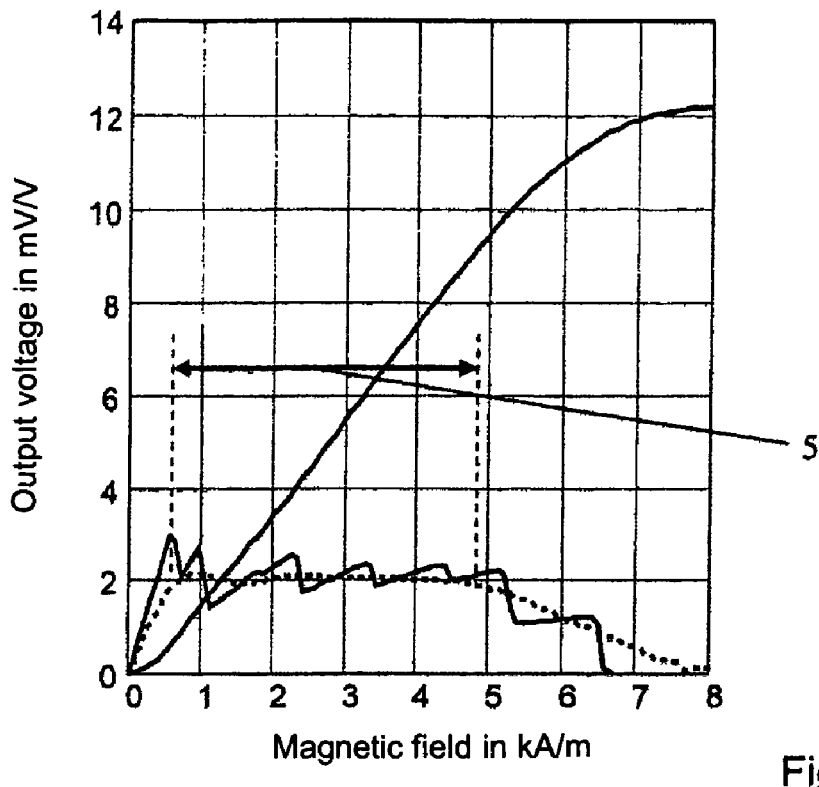
FIG. 5 is a characteristic curve of a linearized AMR sensor, FIG. 6 are characteristic curves of conventional GMR resistors of the spin-valve type.

The output voltage of a sensor according to the invention as a function of the applied magnetic field $H_e$ is shown in FIG. 5 as a solid curve with a positive slope. The two bridge resistors 1 in 4 of the bridge each consist in the illustrated example of eight magneto-resistive layer strips (only four respective layer strips are shown in FIG. 1) of different width. The magneto-resistive layers have a thickness of 25 nm, a saturation magnetization of $10^6$ A/m, and an anisotropy field of 250 A/m. The resistance change of the layer is approximately 2.5%. The total resistance value of each bridge resistor is 1 kΩ. Layer strips with widths of 4; 5; 6; 8; 12; 16; 32 and 64 μm were selected for the bridge resistors 1 and 4. The resistance value without applied magnetic field for the layer strips having different width is, in the same order, 340; 275; 83.3; 82.6; 93.6; 12.5; 68.2 and 40.5Ω. The derivative of the sensor curve is illustrated in relative units in the lower part of FIG. 5 for two situations: the solid line applies when no magnetic field is applied perpendicular to the field to be measured. The slope of the characteristic curve is then on the average constant in the linear range 5, but may exhibit variations because the resistors are made of eight layer strips of different width. The variations can be reduced by increasing the number of layer strips with different width. Advantageously, magneto-resistive layer strips 7 with variable widths 11 can be used, as shown in FIG. 3. Because the layer strips 6 with the smaller widths contribute the most to the resistance, a combination of strips 6 with a constant smaller width and layer strips 7 with a variable larger width 11 is optimal. A second derivative function (dotted line in FIG. 5) has significantly smaller variations than the first function. This function is obtained when according to the invention a magnetic auxiliary field $H_h$ with a smaller field strength is applied perpendicular to the field to be measured. In the illustrated example, an auxiliary field strength of 100 A/m is employed.

Figure 2:
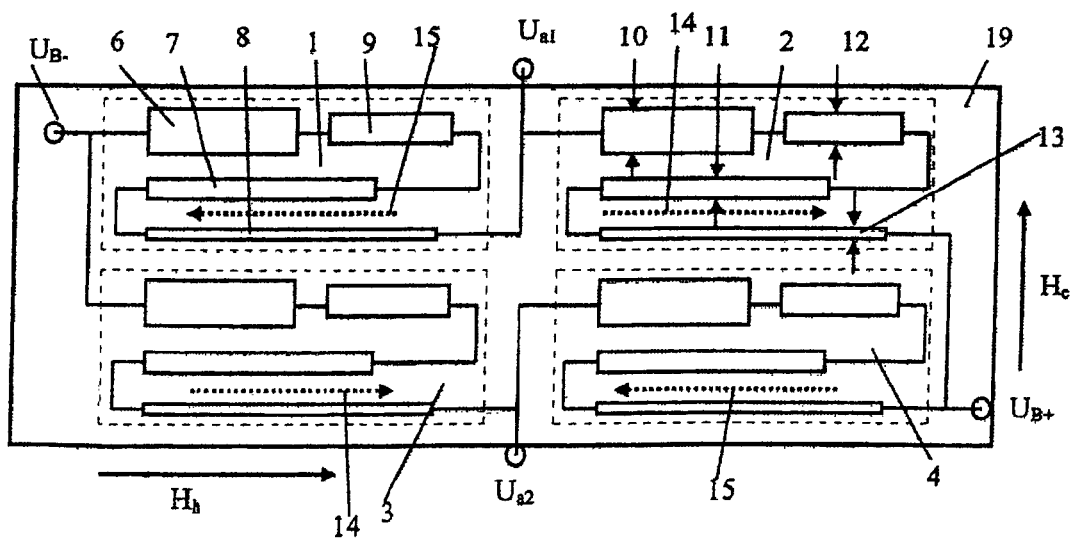
FIG. 2 is a diagram a diagram of an GMR sensor according to the invention with a linearized characteristic curve on a substrate.

FIG. 2 shows schematically the arrangement of a sensor bridge according to the invention composed of four resistors 1; 2; 3; 4 on a substrate 19 when using magneto-resistive spin-valve layer systems. A voltage is applied to the bridge at terminals $U_{B+}$ and $U_{B-}$. The output voltage is measured between the contacts $U_{a1}$ and $U_{a2}$. Each bridge resistor 1; 2; 3; 4 in FIG. 2 consists of four magneto-resistive spin-valve layer strips 6; 7; 8; 9 having different widths 10; 11; 12; 13. In the depicted example, the longitudinal directions of all layer strips 6; 7; 8; 9 are identical, and the four resistors 1; 2; 3; 4 have an identical geometry. The spin-valve layer system consists of a pinned ferromagnetic layer, whose magnetization direction is adjusted by the immediate adjacency of a natural or artificial antiferromagnetic layer and is only slightly affected by the magnetic field strengths to be measured, a free ferromagnetic layer, whose magnetization can be easily rotated by external magnetic fields, and a non-magnetic intermediate layer with a layer thickness selected so that the magnetizations of the two ferromagnetic layers are almost decoupled. The magnetization directions 14; 15 of the pinned ferromagnetic layer are adjusted in both resistors 1; 2 and 3; 4 of each bridge arm to point in opposite directions. The directions are identical in the diagonally opposed resistors 1; 4 and 2; 3. The field $H_e$ to be measured is perpendicular to the magnetization directions 14; 15 and to the longitudinal direction of the strips. The magnetization direction of the free ferromagnetic layer is aligned with the longitudinal direction of the strips if no measurement field $H_e$ is present, and can be rotated in the direction of the auxiliary field $H_h$ by temporarily or permanently applying the auxiliary field $H_h$.

If the initial magnetizations of the free and pinned layers are parallel, then the resistance of a spin-valve layer strip is $$R_p(H_e)=R_0+r/2\cdot[1-\cos(\Theta(H_e)-\Phi(H_e))].$$

If the magnetizations are initially antiparallel, then $$R_a(H_e)=R_0+r/2\cdot[1-\cos(\Theta(H_e)+\Phi(H_e))].$$

$R_0$ is here the magnetic field-independent part of the resistance value and $\Theta(H_e)$ and $\Phi(H_e)$ are the angles between the free or pinned layer and the direction of $H_h$ when a magnetic field is applied. The resistance lift of the spin-valve layer system is r. The corresponding angles for each value of $H_e$ can be obtained by solving the equations $$H_h/H_{01}\cdot\tan(\Theta)+\sin(\Theta)-H_e/H_{01}=0$$

and $H_h/H_{02}\cdot\tan(\Phi)+\sin(\Phi)-H_e/H_{02}=0$ wherein $$H_{01}=(t/w)\cdot M_s+H_{k1}$$

and $H_{02}=(t/w)\cdot M_s+H_{k2}$.

$H_{k1}$ is here the anisotropy field of the free layer, and $H_{k2}$ that of the pinned layer. The same values were assumed for the thickness t of the free and the pinned layer, also for the width w and the saturation magnetization $M_s$.

For a NiFe spin-valve layer system, $H_{k1}$ is approximately 100 A/m and $H_{k2}$ approximately 25 kA/m. As a result, the angles the magnetization of the free layer changes significantly more under the influence of the measurement field $H_e$ than the angle of the magnetization of the pinned layer. However, the latter does not remain constant.

Figure 6:
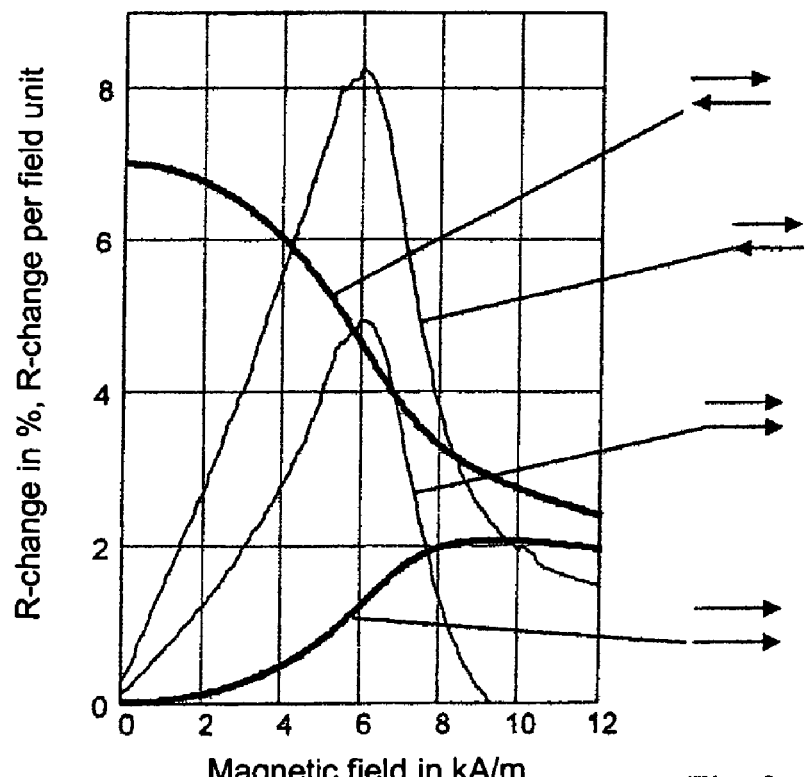

FIG. 6 shows as heavy solid lines the changes of the resistance value of the layer strip of the spin-valve layer system of constant width with a parallel and antiparallel initial position of the magnetization of the free and pinned layer in the measurement field $H_e$. The initial position is indicated by corresponding arrows. The absolute values of the derivatives of the two resistance curves are also shown and are also indicated by arrows. The values of the derivatives at least initially increase linearly with the applied magnetic field. Accordingly, like with anisotropic magneto-resistive layers, the resistance curves have a quadratic dependence. A sensor bridge based on a spin-valve layer system has then also a quadratic curve, if only layer strips with the same shape anisotropy are employed.

Figure 7:
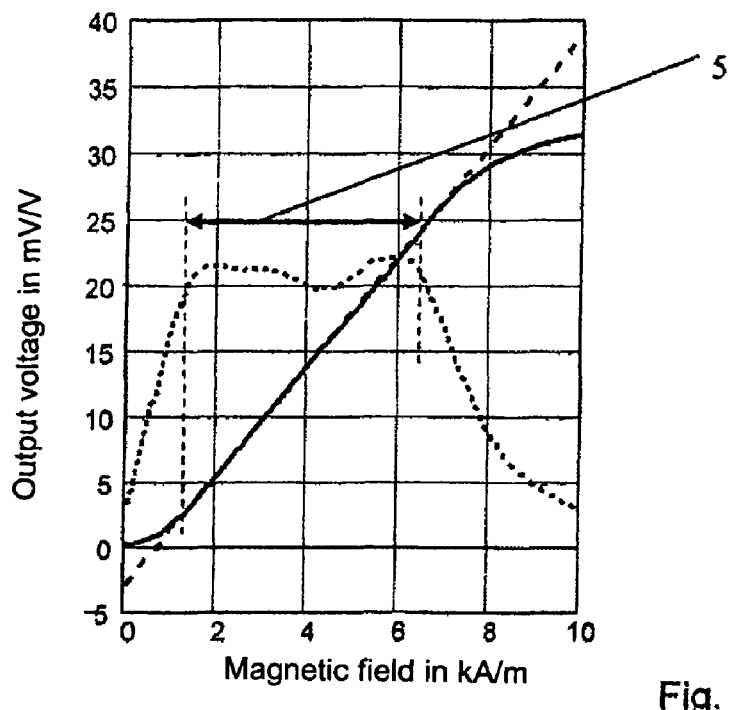
FIG. 7 is a characteristic curve of a linearized GMR sensor of the spin-valve type.

Conversely, for the sensor bridge according to FIG. 2, which according to the invention uses different shape anisotropies, for example, through different widths 10; 11; 12; 13 of the layer strips 6; 7; 8; 9, an essentially linear characteristic curve is obtained, as shown in FIG. 7. Such characteristic curves with a linear range 5 are obtained if, for example, in a NiFe spin-valve layer system with layer thicknesses of the free and pinned layer of each 6 nm with $H_{k1}$ of 100 A/m and $H_{k2}$ of 25 kA/m and a saturation magnetization of $10^6$ A/m five layer strips are electrically connected in series in each resistor, with widths of 1; 2; 3; 4; and 5 μm, respectively. Each bridge resistor 1; 2; 3; 4 has a resistance value of 1 kΩ without applied magnetic field. In the resistors 2; 3 with a parallel direction of the initial magnetization 14, the strips of the aforementioned width have in the same order resistance values of 599; 173; 28.6; 53.8 and 145Ω. In the resistors 1; 4 with an antiparallel direction 15, the corresponding strip resistances were adjusted to 699; 159.4; 53.6; 45.5 and 50Ω. FIG. 7 also shows the relative value of the derivatives of the sensor curve as a dotted line. In the linear range 5 of the characteristic curve the value of the derivatives only shows very small variations. The linear range 5 extends from 1.5 kA/m to 6.5 kA/m. The variations in the derivative can also be reduced by increasing the number of layer strips of different widths, by employing layer strips of variable width according to FIG. 3, or by applying an auxiliary field $H_h$.

The aforedescribed exemplary embodiment of a GMR sensor with resistive strips made of spin-valve layer systems with a linearized curve range not only uses layer strips with a different shape anisotropy according to the invention, which is here achieved by the different strip width, but can also use a large number of geometric associations for the longitudinal directions of the strips and the directions of the remanent magnetization. These geometric associations, however, do not represent a limitation for the invention, which can also be implemented with a large number of other geometric associations.

Figure 8:
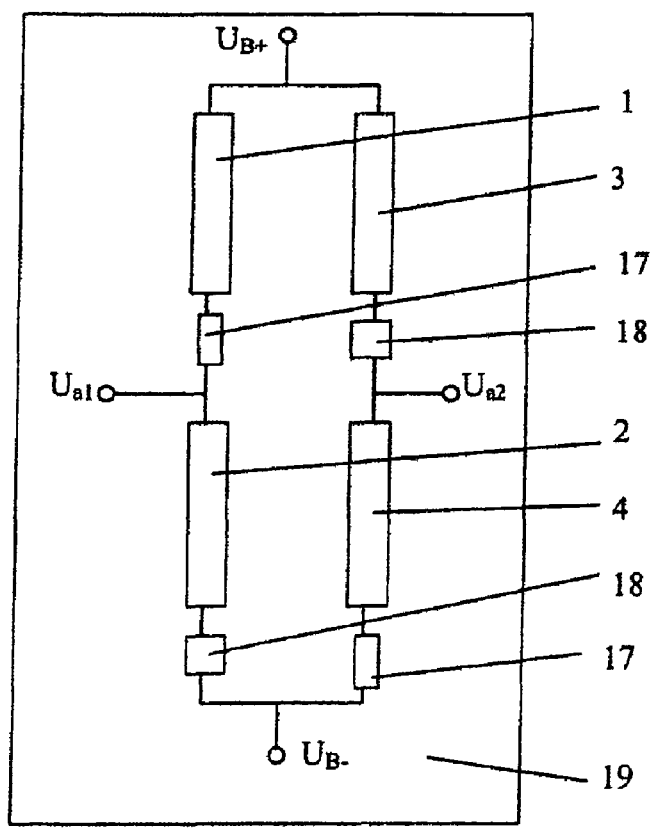
FIG. 8 is an arrangement of a temperature-stabilized magneto-resistive sensor bridge.
Figure 9:
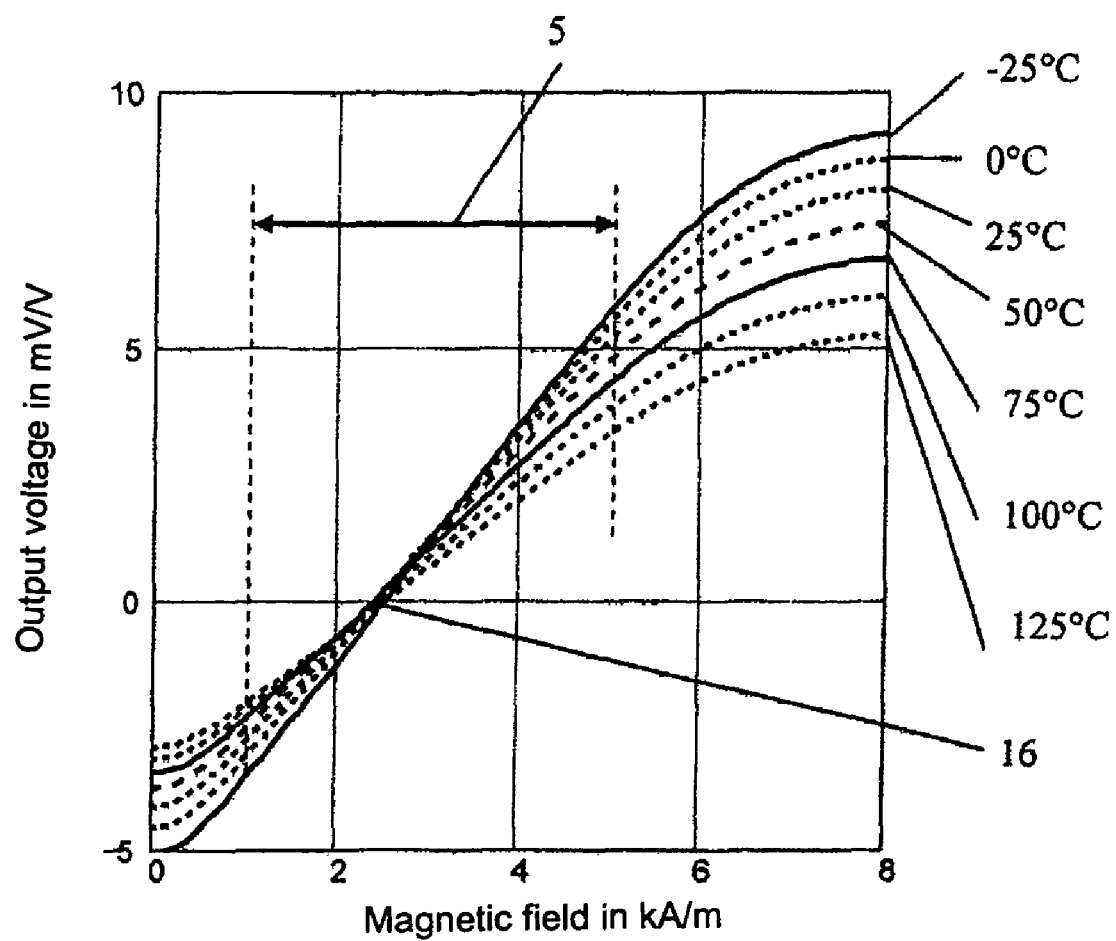
FIG. 9 is a characteristic curve of a linearized magneto-resistive sensor with a temperature-stabilized curve point.
Figure 10:
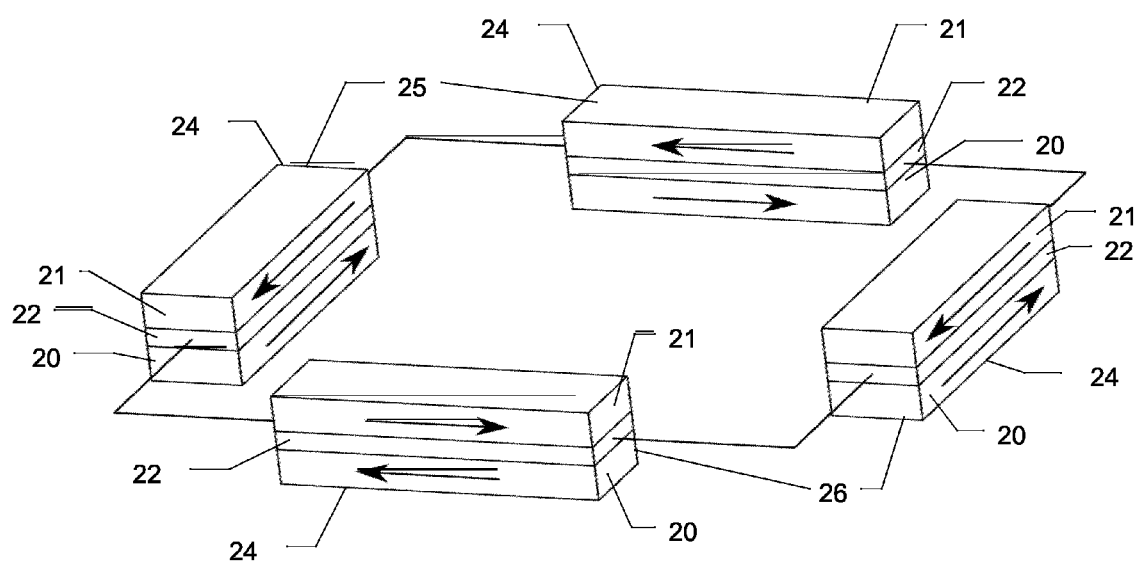
FIG. 10 is a diagram of a spin-valve system according to an embodiment.
Figure 11:
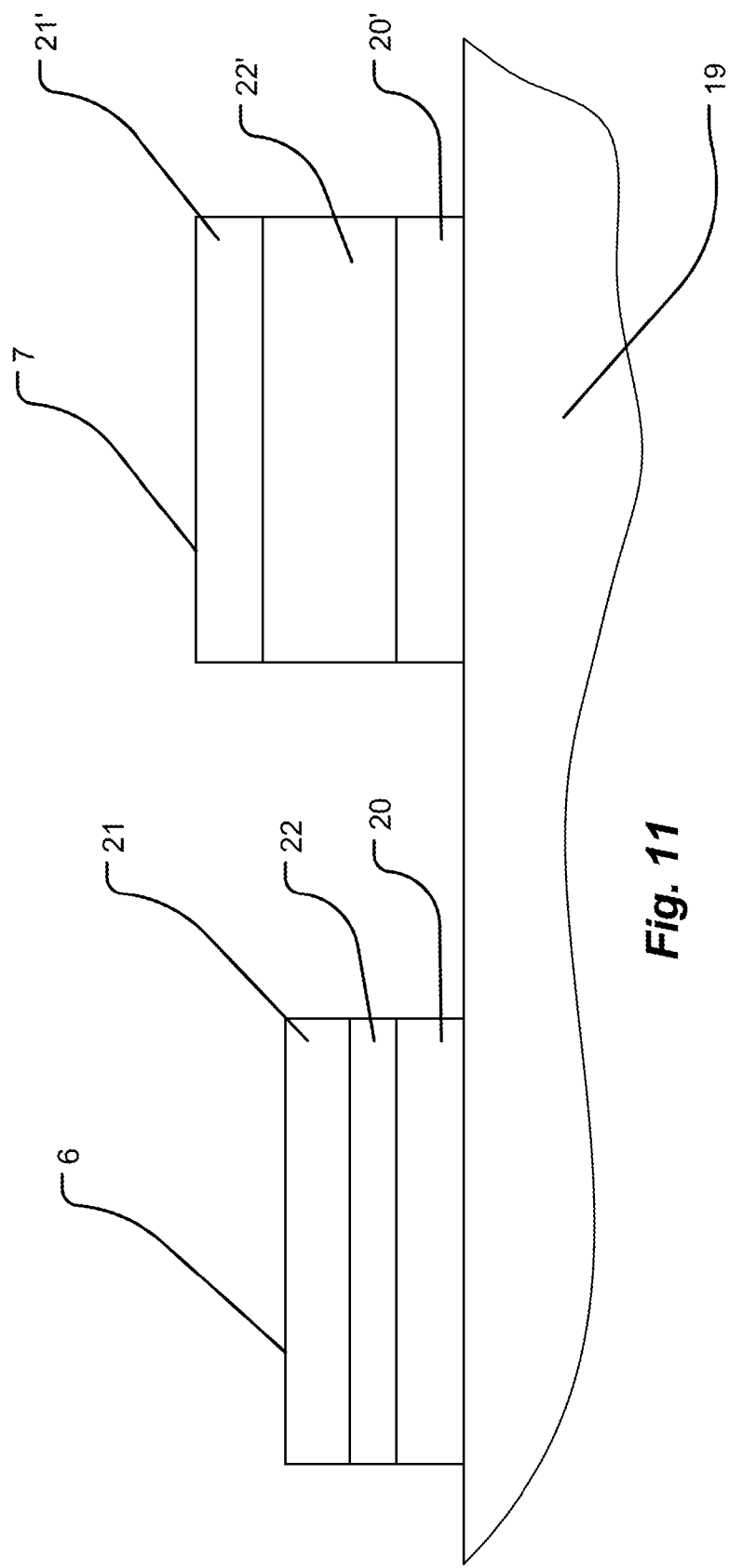
FIG. 11 is a cross section of magneto-resistive layer strips of FIG. 1 in an embodiment.

FIG. 8 shows the electric circuit of a magneto-resistance sensor bridge on a substrate 19, which not only has a wide linearized characteristic curve range 5, but also supplies at a certain point of the characteristic curve a temperature-independent output voltage, as indicated in FIG. 9 where anisotropic magneto-resistive layers are employed. The magneto-resistive sensor bridge in FIG. 8 includes typically the four bridge resistors 1; 2; 3 and 4. The construction of the bridge resistors 1; 2; 3; 4 is not shown in FIG. 8. The bridge resistors can have the structure described above with reference to FIG. 1 and can be made of anisotropic magneto-resistance material. They can also correspond to the structure described in connection with FIG. 2 and employ the GMR effect in a spin-valve layer system. Additional variations in the structure of the resistors 1; 2; 3; 4 are feasible. It is important that the resistance value of the magneto-resistive resistors 1; 2; 3; 4 changes with temperature. In the temperature range of a typical application, the resistance value of magneto-resistive resistors increases approximately linearly with temperature. The increase of the resistance value can therefore be calculated by using a positive temperature coefficient ($T_k$). The change in resistance of the magneto-resistive layers, i.e., the maximum percentage change in the resistance attainable in magnetic field, decreases with increasing temperature. The temperature coefficient of this approximately linear decrease of the change in the resistance and therefore also of the bridge output voltage is negative and has a magnitude which is typically greater than the temperature coefficient of the changes in the resistance.

In FIG. 8, the resistors of additional layer strips 17 are electrically connected in series with the bridge resistors 1 and 4. According to the invention, these additional layer strips 17 have a different temperature coefficient of the resistance then the magneto-resistive layer strips. In this particular exemplary embodiment, additional layer strips 17 with a temperature-independent resistance are selected (i.e., $T_k=0$). In addition, a sensor bridge according to FIG. 1 with anisotropic magneto-resistive layers was assumed, where only the two bridge resistors 1 and 4 are affected by the magnetic field $H_e$ to be measured, whereas the bridge resistors 2 and 3 are field-independent, because the longitudinal direction of their layer strips coincides with the direction of the measurement field. The resistance of the two bridge resistors 1; 2; 3; 4 is each 1 kΩ at a temperature of 25° C. For linearizing the characteristic curves, the bridge resistors 1 and 4 are each composed of eight magneto-resistive layer strips having the characteristic values provided above in the description of FIG. 5. The other layer strips 17 have a resistance of 10Ω. The sensor characteristic curves for different temperature is in the range between −25° C. to 125° C., as shown in FIG. 9, indicate that the additional layer strips 17 generate a common point of intersection of all characteristic curves, which can be used as switching point 16. The magnetic fields strength at which this switching point 16 occurs, depends on the resistance of the additional layer strips 17. This resistance is in the depicted example with 10Ω so small that the resulting decrease in the change of the sensor output signal is approximately 1%, which is insignificant. The output voltage of the common switching point 16, which is located at a magnetic field strength of approximately 2.5 kA, occurs at a zero crossing. This was achieved by adding trim layer regions 18 to the resistors 2 and 3 in FIG. 8. In the depicted exemplary embodiment, the trim layer regions 18 are made of the same material as the magneto-resistive layer strips. They have a resistance value of 1.7Ω. A change of the resistance value of the trim layer regions 18 shifts the output voltage of the common switching point.

It should be noted that the bridge circuit shown in FIG. 8 represents only one advantageous exemplary embodiment of the present invention. The invention includes all magneto-resistive sensor full-bridges or half-bridges that include additional layer strips 17 connected in series with at least one magneto-resistive resistor, wherein the additional layer strips 17 have a temperature coefficient of the resistance which is different from that of the magneto-resistive material. It is hereby unimportant if the magneto-resistive sensor has a characteristic curve with a linearized region or not. Trim layer regions 18 can be associated with one or several bridge resistors 1; 2; 3; 4. The material of the trim layer regions 18 can be identical to that of the magneto-resistive layer strips, the additional layer strips 17 or other materials.

What is claimed is:

1. A magneto-resistive sensor for measuring a magnetic field based on an anisotropic magneto-resistive (AMR) effect or a gigantic magneto-resistive (GMR) effect, comprising:
    a substrate;
    a plurality of resistors formed from magneto-resistive layer strips and arranged in form of a half or full bridge circuit on the substrate, said plurality of resistors having a resistance value that depends on a magnetic field strength,
    wherein at least one of the plurality of resistors includes a magneto-resistive layer strip with a shape anisotropy different from a shape anisotropy of another magneto-resistive layer strip for increasing a linear region on a characteristic curve describing a dependence of the resistance of a sensor on the magnetic field strength, the shape anisotropy being caused by differences in width of the magneto-resistive layer strips, the magneto-resistive layer strips having a same shape.

2. The magneto-resistive sensor of claim 1, wherein at least one of the magneto-resistive layer strips of a resistor has a thickness different from another one of the magneto-resistive layer strips.

3. The magneto-resistive sensor of claim 1, wherein at least one of the magneto-resistive layer strips is made of a material different from another one of the magneto-resistive layer strips.

4. The magneto-resistive sensor of claim 1, wherein a spacing between the magneto-resistive layer strips of a resistor is not uniform.

5. The magneto-resistive sensor of claim 1 wherein the magneto-resistive layer strips include sublayers, and wherein a coupling field strength between the sublayers of the magneto-resistive layer strips is different.

6. The magneto-resistive sensor of claim 1, wherein each of the resistors comprises a plurality of magneto-resistive layer strips which are connected in series and have a parallel longitudinal direction.

7. The magneto-resistive sensor of claim 6, wherein the resistors are formed of layer strips exhibiting the AMR effect and the longitudinal directions of the layer strips of the two resistors of the half bridge circuit form a right angle.

8. The magneto-resistive sensor of claim 7, wherein the plurality of resistors form a full-bridge circuit and the longitudinal directions of the layer strips of the resistors which are diagonally opposed in the full bridge circuit are parallel to each other.

9. The magneto-resistive sensor of claim 8, wherein two diagonally opposed resistors of the full bridge circuit have layer strips of different widths with a parallel longitudinal direction.

10. The magneto-resistive sensor of claim 9, wherein a direction of the magnetic field to be measured is essentially perpendicular to the longitudinal direction of the layer strips of different widths.

11. The magneto-resistive sensor of claim 9, wherein a constant magnetic auxiliary field is applied in the longitudinal direction of the layer strips of different widths.

12. The magneto-resistive sensor of claim 1, wherein the plurality of resistors comprise two resistors forming a half-bridge circuit and the two resistors of the half bridge circuit are formed of GMR layer strips and wherein a direction of a remanent magnetization in the two resistors of the half bridge circuit is different.

13. The magneto-resistive sensor of claim 1, wherein the plurality of resistors form a full-bridge circuit and are formed of layer strips exhibiting the GMR effect and directions of the magnetization of the GMR layer strips of the resistors which are diagonally opposed in the full bridge circuit are parallel to each other.

14. The magneto-resistive sensor of claim 13, wherein the directions of the magnetization of the GMR layer strips are parallel to a longitudinal direction of the strips.

15. The magneto-resistive sensor of claim 1, wherein at least one of the plurality of resistors comprises at least one trim layer region with an adjustable resistance value.

16. The magneto-resistive sensor of claim 15, wherein a material of the at least one trim layer region is the same as a material of the magneto-resistive layer strips.

* * * * *